United States Patent

Yastrov

[15] 3,665,333

[45] May 23, 1972

[54] PUSH-PULL AMPLIFIER

[72] Inventor: Henry Yastrov, Langhorne, Pa.

[73] Assignee: Jerrold Electronics Corporation, Hatboro, Pa.

[22] Filed: May 5, 1970

[21] Appl. No.: 34,704

[52] U.S. Cl. ....................330/53, 330/118

[51] Int. Cl. ....................H03f 3/60, H03l 3/28

[58] Field of Search ....................330/53, 118; 333/11

[56] References Cited

UNITED STATES PATENTS

| | | | |
|---|---|---|---|
| 3,371,284 | 2/1968 | Engelbrecht | 330/53 X |
| 3,381,244 | 4/1968 | Dalley | 333/11 X |
| 3,533,008 | 10/1970 | Lee | 330/61 |
| 3,454,905 | 7/1969 | Winegard | 333/11 X |

*Primary Examiner*—Nathan Kaufman

*Attorney*—Sandoe, Hopgood and Calimafde

[57] ABSTRACT

In an improved push-pull amplifier, the input and output phase inverters each include 3db hybrid splitters with a 180° phase shift transformer in one output leg and a 0° phase shift transformer in the other leg. Each phase inverter is separately mounted on a plug-in circuit board having provisions for releasable connection with the inputs and outputs of the amplifier sections.

5 Claims, 7 Drawing Figures

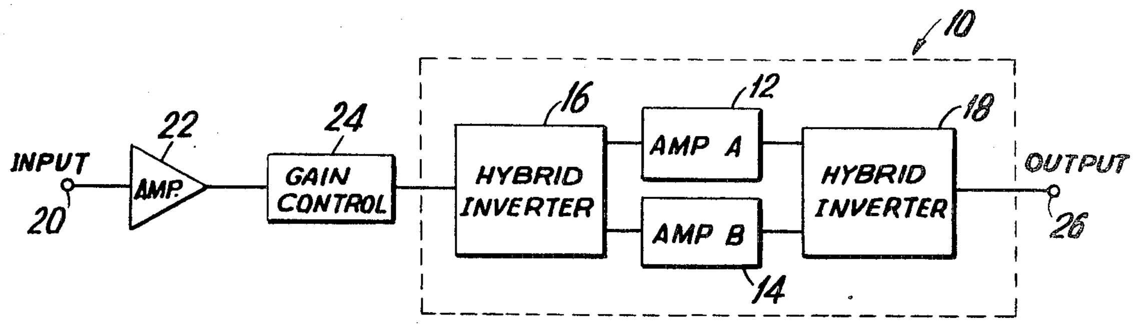
FIG. 1
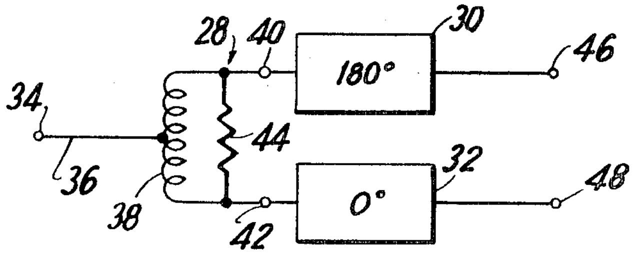
FIG. 2
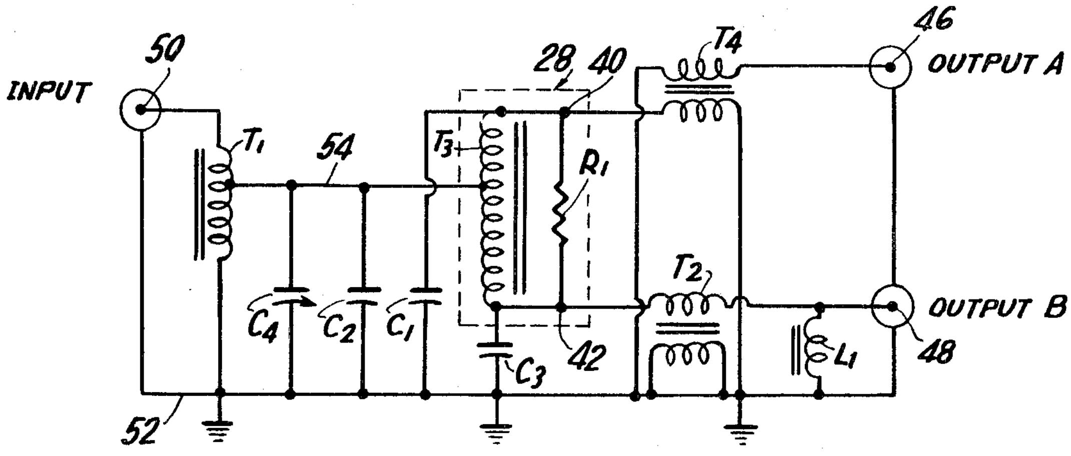
FIG. 3
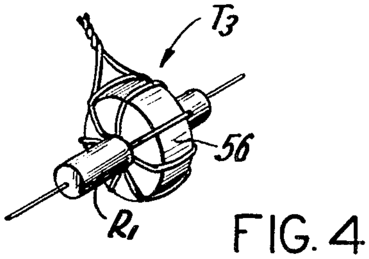
INVENTOR.
HENRY YASTROV
BY
Sandoe, Hopgood & Calimafde
ATTORNEYS INVENTOR.
HENRY YASTROV
BY
Sandoe, Hopgood & Calimafde
ATTORNEYS

PUSH-PULL AMPLIFIER

The present invention relates generally to amplifiers, and more particularly to an improved push-pull amplifier which allows for greater ease of component testing and alignment.

In many applications of amplifiers, such as in the radio, television and CATV fields, it is required to reduce or completely suppress second order harmonic distortion. As a result push-pull amplifiers are employed in practically all applications in which the suppression of even harmonic distortion is required.

As is known, the input signal to a push-pull amplifier is applied to a phase inverter or splitter so that the inputs of the two amplifier sections receive inputs which are 180° out of phase. The outputs of the amplifiers are then combined by a phase inverter or splitter to provide a single amplified output signal in which the second order harmonics are cancelled out.

In order for the amplifier to operate at maximum efficiency, that is, at the lowest level of harmonic distortion, both amplifier sections should provide equal gains over the frequency range of interest. Moreover, the outputs of the input phase inverter must be at equal levels and as near to 180° out of phase with one another as possible to ensure harmonic cancellation.

In the known push-pull amplifiers it is usually very difficult to adjust and check the phase inverters so as to consistently achieve the proper amplitude and phase relationship at the inputs of the amplifier sections, and to separately balance and test the two amplifier sections all of which is required to achieve the effective suppression of second-order harmonics.

It is therefore an object of the invention to provide an improved push-pull amplifier.

It is a further object of the invention to provide a push-pull amplifier in which the component phase inverters and amplifier sections can be separately balanced and adjusted with greater facility than has heretofore been possible.

It is another object of the invention to provide a push-pull amplifier in which the conditions necessary to reduce or effectively cancel second order harmonic distortions can be more readily established.

It is yet another object of the invention to provide a push-pull amplifier in which the location of faults and alignment of the amplifier sections are both considerably simplified.

To these ends, the push-pull amplifier of the invention includes a pair of hybrid inverters each of which includes a 3db hybrid splitter followed by a 180° phase inverter, both before and after the push-pull amplifier sections. The hybrid inverters are each mounted on a plug-in unit which is readily coupled and uncoupled from the amplifiers. This arrangement permits the ready disconnection of the inverters from the amplifiers when desired to permit the alignment and balancing of the phase inverters and amplifier sections in a markedly simplified manner, thereby to permit the establishment of operating conditions for achieving the optimum cancellation of second order harmonic products.

To the accomplishment of the above and to such further objects as may hereinafter appear, the present invention relates to a push-pull amplifier, substantially as defined in the appended claims and as described in the following specification taken together with the accompanying drawings in which:

FIG. 1 is a schematic diagram in block diagram form of the push-pull amplifier of the invention;

FIG. 2 is a simplified schematic of the hybrid inverter of the amplifier of FIG. 1;

FIG. 3 is a more detailed schematic diagram of the hybrid inverter;

FIG. 4 is a perspective view illustrating a suggested component mounting arrangement in the hybrid inverter;

Figure 5:
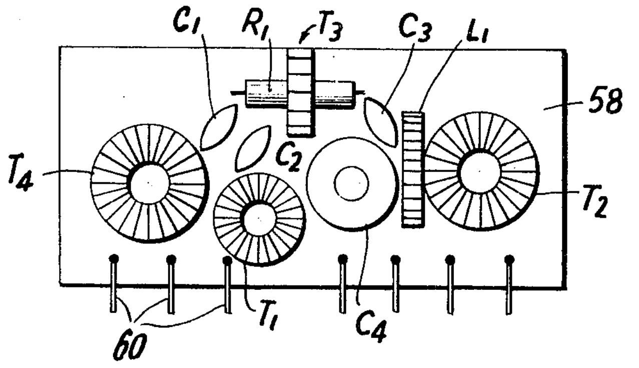
FIG. 5 is a plan view of one of the plug-in hybrid inverters used in the amplifier of the invention.

As shown in FIG. 1 the push-pull amplifier of the present invention comprises those elements enclosed by the broken-line area 10. As is conventional, the amplifier includes two substantially identical amplifier sections 12 and 14 to which signals 180° phase out of phase with one another are applied. The output signals of the amplifier sections are then combined to produce an amplified output signal having minimum distortion products.

In accord with the present invention the 180° phase shifted input signals are produced by an input 3db hybrid inverter 16, and the outputs of amplifier sections 12 and 14 are combined in a second hybrid inverter 18. The input signal is applied at an input terminal 20 and amplified in a pre-amplifier 22. The amplified output signal of pre-amplifier 22 is coupled to a manual or automatic gain control 24, the output of which is in turn coupled to the input of hybrid inverter 16. The amplified output signal of the push-pull amplifier is obtained at an output terminal 26 coupled to the output of hybrid inverter 18.

As shown in FIG. 2, each of the hybrid inverters 16 and 18 of the amplifier of FIG. 1 includes a 3db hybrid splitter 28 having a 180° phase shift means 30 coupled to one of its legs, and a 0° phase shift means 32 coupled to the other of its legs. The hybrid splitter 28 includes an input terminal 34 coupled by a line 36 to the midpoint or center tap of a transformer winding 38. As is known to those skilled in the art the input impedance Zo of the hybrid splitter is equal to one-half of that at the output ports 40 and 42. A resistance 44 having a value of 4Zo is connected in shunt across winding 38. The 180° and 0° phase shift means 30 and 32 are preferably phase-shift transformers respectively connected between output ports 40 and 42 and output terminals 46 and 48.

When the hybrid inverter of FIG. 2 is used as the input inverter 16 of FIG. 1, terminal 34 is coupled to the output of gain control 24, and output terminals 46 and 48 are respectively coupled to the inputs of amplifier sections 12 and 14. When the FIG. 2 inverter is employed as the output hybrid inverter 18 of FIG. 1, terminals 46 and 48 become input terminals and are coupled respectively to the outputs of amplifier sections 12 and 14. Terminal 34 in this case serves as the output of the inverter and is coupled to the amplifier output terminal 26.

FIG. 3 is a detailed schematic of an operative embodiment of the hybrid inverter of FIG. 2, and has its input and output terminals arranged for operation as the input hybrid inverter of FIG. 1. For clarity of understanding, wherever elements in FIG. 3 correspond to those shown in FIG. 2, the reference numerals of FIG. 2 will be given in parentheses. The input signal is applied at a connector 50 which has its outer conductor grounded at line 52. The central conductor of the input connector is applied to one end of a winding of autotransformer T1, the other end of which is grounded.

The tap of transformer T1 is connected by a line 54 to the tap of winding T3(38) of the hybrid splitter 28. A variable capacitor C4 and a fixed capacitor C2 are coupled in parallel between line 54 and ground line 52, and capacitors C1 and C3 are coupled between the ends of winding T3(38) and line 52. A resistor R1(44) is coupled across the ends of winding T3(38).

Terminal 40 of splitter 28 is coupled to one end of the primary winding of a transformer T4(30), the other end of which is connected to ground. The secondary winding of transformer T4 has one end coupled to line 52 and its other end coupled to output terminal 46. Both ends of the primary winding of a transformer T2(32) are connected to ground line 52, and the secondary winding of that transformer is coupled between terminals 42 and 48. Transformer T4 thus introduces a phase shift of 180° and transformer T2 introduces a 0° phase shift. A choke coil L1 is coupled between terminal 48 and ground line 52.

FIG. 4 illustrates a preferred manner of mounting transformer T3 and resistor R1 of the inverter shown schematically in FIG. 3. The transformer T3 is wound on a toroidal core 56 and resistor R1 is passed through the central opening in the core and its end conductors extend axially with respect to core 56.

In an another aspect of the invention, the hybrid inverters 16 and 18 are connected in a plug-in, releasable manner with respect to the amplifier sections 12 and 14. As will be more completely described below, this mounting arrangement permits the ready separation of the individual basic components of the amplifier, to wit, the amplifier sections and the hybrid inverters, for separate alignment, checking and balancing of these components.

As shown in FIG. 5, the components forming the hybrid inverter are all mounted and suitably interconnected on a printed circuit board 58, the components of the inverter being identified in FIG. 5 by the same reference characters used in FIG. 3. The input and output terminals of the inverter are connected to pins 60 which extend beyond a common edge of the board. Pins 60 of the two hybrid inverters 16 and 18 are received in appropriate sockets provided for that purpose in the amplifier sections (not shown herein) to thereby releasably mount and connect the inverters on the amplifier sections. As a result of the mounting arrangement of the inverters and amplifier sections, the proper amplitude and phase relationship of the signals at both the inputs and outputs of the amplifier sections are always maintained independent of which inverter is used in either the input or output position.

By removing the hybrid inverters from the amplifiers, such as during a troubleshooting operation, and replacing them with suitable plug-in test fixture boards (not shown), the amplifier is effectively divided into three sections, to wit, the input stage of pre-amplifier 22 and gain control 24, and the individual amplifier sections 12 and 14.

Each amplifier section can then be separately aligned and checked to ensure proper amplitude and frequency bandwidth characteristics by simultaneously sweeping both amplifier sections and employing automatic switching techniques known to those skilled in the art. However, to ensure optimum suppression of distortion by the amplifier, there must also be a proper phase relationship of the input and output signals as provided by the plug-in hybrid inverters.

Figure 6:
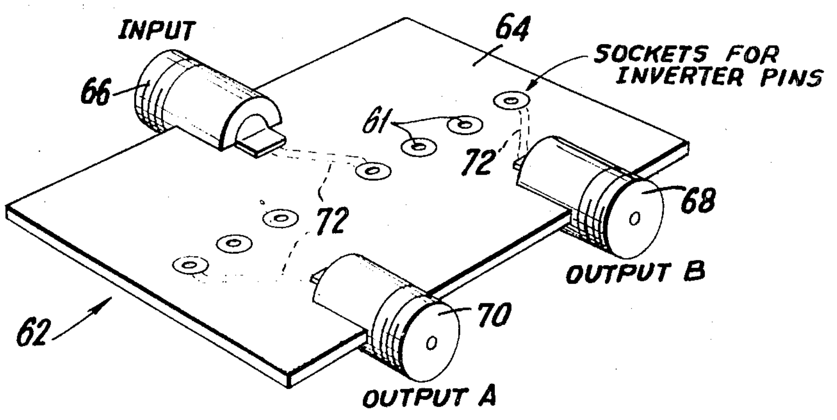
FIG. 6 is a perspective view of a test fixture for testing the impedance match-insertion loss of the hybrid inverter.

The input-output impedance match and insertion loss of the hybrid inverters may be checked by means of the test fixture shown in FIG. 6 which has sockets 61 for receiving pins 60 of the inverter board 58. The fixture generally designated 62 comprises a printed circuit board 64 in which sockets 61 are formed. An input connector 66 and a pair of output connectors 68 and 70 are mounted on opposite edges of the board. Suitable conducting areas 72 are formed on the undersurface of board 42 to provide electrical conduction paths between connectors 66–70 and the appropriate sockets for making connection with the corresponding pins of the hybrid inverter when the latter is plugged into the fixture. The impedance and insertion loss of the hybrid inverter can then be tested by the use of a sweep generator, detector, impedance bridge, and oscilloscope as will be apparent to those skilled in the art.

Figure 7:
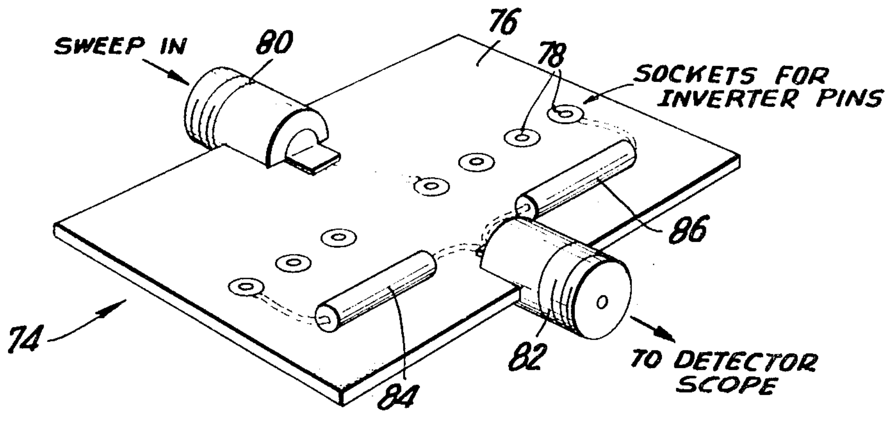
FIG. 7 is a perspective view of a fixture for testing the phase shift of the hybrid inverter.

The phase shift of the inverters can be set to 180° by means of the phase-shift fixture of FIG. 7. That fixture generally designated 74 includes a printed circuit board 76 which includes sockets 78 for receiving pins 60 of the inverter. An input connector 80 and an output connector 82 are mounted on opposite edges of the board. A pair of 75-ohm resistors 84 and 86 are connected between those sockets which receive the output legs of the inverter and the output connector 82, and the input connector 80 is connected by conducting strip 88 to the corresponding pin-receiving socket.

In practice, to check the inverter phase shift, an r.f. sweep generator is connected to input connector 80 and the phase-shift produced by the inverter is sensed at the output connector 82; if the phase shift is 180°, the output will be at a minimum or zero. By sweeping the input between 20 and 300 $MH_z$, an indication of 180° phase shift may be readily obtained at each frequency. The inverter tests are preferably performed at the time the inverters are manufactured, although these tests may also be performed at any time after installation simply by removing the inverters from the amplifier sections and inserting them into the appropriate test fixture.

Thus, as a result of the plug-in feature of the input and output hybrid inverters with respect to the amplifier sections, the basic components of the amplifier can be readily and separately aligned and checked, and in the event that troubleshooting of the amplifier becomes necessary, the inverters can be removed, and tests performed on the separate amplifier sections as described above to determine which of them is at fault. Thus amplifier alignment and troubleshooting which has heretofore been considered to be a very complicated operation has been converted, by the use of the present invention, to a relatively simple and reliable procedure.

While only a single embodiment of the present invention has been herein specifically described it will be apparent that modifications may be therein without departing from the spirit and the scope of the invention.

I claim:

1. In a push-pull amplifier including first and second amplifier sections, an input phase inverter comprising a first 3db hybrid splitter having an input coupled to a source of an input signal and first and second output legs, first 180° phase shift means coupled to one of said output legs, and first 0° phase shift means coupled to the other of said output legs, first and second ouput terminals coupled respectively to said first 0° and 180° phase shift means for respective connection to the inputs of said first and second amplifier sections, an output combiner comprising a second 3db hybrid splitter having first and second legs for respective connection to the outputs of said first and second amplifier sections, second 0° phase shift means coupled to one leg of said second hybrid splitter, and second 180° phase shift means coupled to the other leg of said second hybrid splitter.

2. In the amplifier of claim 1, in which the elements of said phase inverter are mounted and connected on a printed circuit card, said card comprising plug-in means for releasable coupling of said inverter to the input of said first and second amplifier sections.

3. The amplifier of claim 2, further comprising a second phase inverter as defined in claim 1 having components mounted on a second plug-in unit for releasable coupling to the outputs of said first and second amplifier sections.

4. In combination with the amplifier of claim 3, a first fixture for releasably receiving one of said phase inverters for testing the impedance and insertion loss thereof, and a second test fixture for testing the phase shift characteristics of said phase inverter.

5. The phase inverter of claim 1, in which said 0° and 180° phase shift means include first and second transformers respectively having their primary and secondary winding series coupled to the output legs of said hybrid splitter.

* * * * *